US012361309B2

(12) United States Patent
Li et al.

(10) Patent No.: US 12,361,309 B2
(45) Date of Patent: *Jul. 15, 2025

(54) METHOD, DEVICE, STORAGE MEDIUM AND ELECTRONIC DEVICE FOR DATA READING

(71) Applicant: Origin Quantum Computing Technology Co., Ltd., Anhui (CN)

(72) Inventors: Ye Li, Hefei (CN); Ningbo An, Hefei (CN); Menghan Dou, Hefei (CN)

(73) Assignee: Origin Quantum Computing Technology Co., Ltd., Anhui (CN)

( * ) Notice: Subject to any disclaimer, the term of this patent is extended or adjusted under 35 U.S.C. 154(b) by 205 days.

This patent is subject to a terminal disclaimer.

(21) Appl. No.: 18/039,429

(22) PCT Filed: May 26, 2021

(86) PCT No.: PCT/CN2021/096095
§ 371 (c)(1),
(2) Date: May 30, 2023

(87) PCT Pub. No.: WO2022/110704
PCT Pub. Date: Jun. 2, 2022

(65) Prior Publication Data
US 2024/0095565 A1    Mar. 21, 2024

(30) Foreign Application Priority Data

Nov. 30, 2020  (CN) .......................... 202011376079.X
Dec. 10, 2020  (CN) .......................... 202011436096.8

(51) Int. Cl.
*G06N 10/20* (2022.01)
*G06N 10/40* (2022.01)
*G11C 13/04* (2006.01)

(52) U.S. Cl.
CPC ............ *G06N 10/40* (2022.01); *G06N 10/20* (2022.01); *G11C 13/04* (2013.01)

(58) Field of Classification Search
CPC ..................................... G06N 10/40
See application file for complete search history.

(56) References Cited

U.S. PATENT DOCUMENTS 11,983,606 B2 *   5/2024   Li ........................ G06N 10/20
2022/0147266 A1 * 5/2022   Hann .................... G06F 3/0604

\* cited by examiner

*Primary Examiner* — Hoai V Ho
(74) *Attorney, Agent, or Firm* — Baker Botts LLP

(57) ABSTRACT

Disclosed are a method, device, storage medium and electronic device for data reading, applied to a pre-constructed quantum random access memory (QRAM) architecture for accessing data, wherein the QRAM architecture is a binary tree structure and comprises the following nodes: N layers of subtree node and one layer of leaf node, the N being an address length; the method includes: determining an address represented by a quantum state distributedly stored in each layer of subtree node; and moving, according to the address, data stored in the leaf node to the upper layer of subtree node via a first preset quantum circuit, until data corresponding to the address is output at a subtree node at the root of the binary tree structure.

18 Claims, 7 Drawing Sheets

METHOD, DEVICE, STORAGE MEDIUM AND ELECTRONIC DEVICE FOR DATA READING

CROSS-REFERENCE TO RELATED APPLICATIONS

This application is a National Stage of International Application No. PCT/CN2021/096095, filed on May 26, 2021, which claims priority to Chinese Patent Application No. 202011436096.8 entitled "METHOD, DEVICE, STORAGE MEDIUM AND ELECTRONIC DEVICE FOR READING DATA BASED ON ADDRESS", filed on Dec. 10, 2020; and Chinese Patent Application No. 202011376079.X entitled "METHOD, DEVICE, STORAGE MEDIUM, AND ELECTRONIC DEVICE FOR DATA READING", filed on Nov. 30, 2020, all of which are hereby incorporated by reference in their entireties.

TECHNICAL FIELD

The present application relates to the technical field of quantum computing, in particular to a method, device, storage medium and electronic device for data reading.

BACKGROUND

A quantum computer is a physical device that follows the Laws of Quantum Mechanics to perform high-speed mathematical and logical operations, and to store and process quantum information. A quantum computer is defined as any device that processes and computes quantum information and runs a quantum algorithm. Quantum computers have become a key technology being researched, because of their ability to solve mathematic problems more efficiently than ordinary computers, for example, it can speed up the time to crack RSA keys from hundreds of years to only a few hours.

One of the most fundamental problems in practical implementations of quantum information processing is to develop a valid procedure for retrieving classical/quantum data from databases and converting the retrieved data into quantum superposition states. A Quantum Random Access Memory (QRAM), which stores information and enables superposition state queries, could play a key role in dramatically accelerating quantum algorithms for data analysis (including big data machine learning applications). A QRAM is a memory system for quantum computers, and is a quantum version of a classical computer RAM. A QRAM can be used for creating a quantum superposition state containing information. In contrast to a RAM which needs to read data one by one, a QRAM can read superimposed data in the form of superposition address. At present, however, a QRAM is still insufficient in valid physical structures, and not easy to implement and expand, bringing certain difficulties to the analysis and research of complex quantum algorithms.

SUMMARY

The present application aims to providing a method, device, storage medium and electronic device based on data reading, in order to address the deficiencies in the prior art. It is capable of providing a valid QRAM architecture realizing writing and storing an address and reading data both in quantum state form, thereby speeding up analysis and verification of a complex quantum algorithm.

One embodiment of the present application provides a method for reading data based on address, applied to a pre-constructed quantum random access memory (QRAM) architecture for accessing data, wherein the QRAM architecture is a binary tree structure and comprises the following nodes: N layers of subtree node and one layer of leaf node, the N being an address length; the method includes:

determining an address represented by a quantum state distributedly stored in each layer of subtree node;

moving, according to the address, data stored in the leaf node to the upper layer of subtree node via a first preset quantum circuit, until data corresponding to the address is output at a subtree node at the root of the binary tree structure.

In one embodiment of the application, the subtree node includes address bits and first data bits, and the leaf node include second data bits for storing data;

said "determining an address represented by a quantum state distributedly stored in each layer of subtree node" includes:

determining an address represented by a quantum state in address bits distributedly stored in each layer of subtree node; wherein one layer of subtree node corresponds to one bit of address.

In one embodiment of the application, said "moving, according to the address, data stored in the leaf node to the upper layer of subtree node via a first preset quantum circuit, until data corresponding to the address is output at subtree node at the root of the binary tree structure" includes:

starting from the leaf node, moving data stored in the leaf node to data bits of the upper layer of subtree node via a first preset quantum circuit, continuing to move, data stored in data bits of subtree node in the current layer to data bits of the upper layer of subtree node via the first preset quantum circuit, until data corresponding to the address is obtained and output at data bits of subtree node at the root of the binary tree structure; wherein the first preset quantum circuit corresponds to a basic circuit structure in the binary tree structure, the basic circuit structure comprising address bits and data bits of one subtree node and data bits of two child nodes in the lower layer of the one subtree node, the data moved to a data bit of the subtree node in the upper layer is determined from the address stored in address bits in the basic circuit structure.

In one embodiment of the application, the method further includes:

receiving the address represented by a quantum state; parsing the address; and storing distributedly each bit of the address into address bits of subtree node of a corresponding layer.

In one embodiment of the application, said "storing distributedly each bit of the address into address bits of subtree node of a corresponding layer" includes:

for each bit of the address, starting from k=N, moving the k-th bit of the address to the first layer of subtree node at the root of the binary tree structure;

starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

In one embodiment of the application, said "storing distributedly each bit of the address into address bits of subtree node of a corresponding layer" includes:
for each bit of the address, starting from k=1, moving the k-th bit of the address to the first layer of subtree node at the root of the binary tree structure;
starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;
wherein, after moving the k-th bit of the address in the current layer of subtree node to the lower layer of subtree node, moving a bit of the address next to the k-th bit of the address from the upper layer of subtree node to the current layer of subtree node.

In one embodiment of the application, said "moving the k-th bit of the address to the first layer of subtree node at the root of the binary tree structure" includes:
moving the k-th bit of the address to data bits of the first layer of subtree node at the root of the binary tree structure;
said "starting from the first layer of subtree node, executing repeatedly moving of the k-th bit of the address in the current layer of subtree node to the lower layer of subtree node, until it is moved to the address bits of the subtree node of the k-th layer" comprises:
starting from the first layer of subtree node, executing repeatedly a second preset quantum circuit corresponding to the basic circuit structure in the binary tree structure, so as to move the k-th bit of the address stored in data bits of the subtree node in the basic circuit structure to data bits of two child nodes in the lower layer, until the k-th bit of the address is moved to a data bit of the k-th layer of the subtree node,
swapping the quantum state of the data bits of the subtree node of the k-th layer with the quantum state of the address bits of the subtree node, so as to move the k-th bit of the address to the address bit of the subtree node of the k-th layer.

In one embodiment of the application, the method further includes, after data corresponding to the address is output at a subtree node at the root of the binary tree structure:
executing uncomputing on the QRAM structure to restore the QRAM structure to its initial state.

In one embodiment of the application, data stored in the leaf node is a multi-bit number, wherein parent nodes of leaf nodes corresponding to each bit of the multi-bit number are all different; or
data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

Another embodiment of the present application provides a device for reading data based on address, applied to a pre-constructed quantum random access memory (QRAM) architecture for accessing data, wherein the QRAM architecture is a binary tree structure and comprises the following nodes: N layers of subtree node and one layer of leaf node, the N being an address length; the device including:
a determining module, configured for determining an address represented by a quantum state distributedly stored in each layer of subtree node;
an outputting module, configured for moving, according to the address, data stored in the leaf node to the upper layer of subtree node via a first preset quantum circuit, until data corresponding to the address is output at a subtree node at the root of the binary tree structure.

Another embodiment of the present application provides a data reading method, applied to a pre-constructed QRAM architecture for accessing data, wherein the QRAM architecture is a binary tree structure and comprises the following nodes: N layers of subtree node and one layer of leaf node, the subtree node comprising address bits and first data bits, and the leaf node comprising second data bits for storing data, the N being an address length, the method comprising:
receiving the address represented by a quantum state;
parsing the address, and moving each bit of the address respectively to address bits of subtree node of a corresponding layer; wherein each one bit of the address corresponds to one respective layer of the N layers of subtree node; and
starting from the leaf node, moving, according to an address stored in address bits of each layer of subtree node, data stored in the leaf node to data bits of the upper layer of subtree node, until data corresponding to the address is output at a subtree node at the root of the binary tree structure.

In one embodiment of the application, said "moving each bit of the address respectively to address bits of subtree node of a corresponding layer" includes:
for each bit of the address, starting from k=N, moving the k-th bit of the address to the first layer of subtree node at the root of the binary tree structure;
starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

In one embodiment of the application, said "moving each bit of the address respectively to address bits of subtree node of a corresponding layer" includes:
for each bit of the address, starting from k=1, moving the k-th bit of the address to the first layer of subtree node at the root of the binary tree structure;
starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;
wherein, after moving the k-th bit of the address in the current layer of subtree node to the lower layer of subtree node, moving a bit of the address next to the k-th bit of the address from the upper layer of subtree node to the current layer of subtree node.

In one embodiment of the application, said "moving the k-th bit of the address to the first layer of subtree node at the root of the binary tree structure" includes:
moving the k-th bit of the address to data bits of the first layer of subtree node at the root of the binary tree structure;
said "starting from the first layer of subtree node, executing repeatedly moving of the k-th bit of the address in the current layer of subtree node to the lower layer of subtree node, until it is moved to the address bits of the subtree node of the k-th layer" comprises:

determining basic circuit structure in the binary tree structure, wherein the basic circuit structure comprising address bits and data bits of one subtree node and data bits of two child nodes in the lower layer of the one subtree node;

starting from the first layer of subtree node, executing repeatedly a first basic quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node, swapping the quantum state of the data bits of the subtree node of the k-th layer with the quantum state of the address bits of the subtree node, so as to move the k-th bit of the address to the address bit of the subtree node of the k-th layer.

In one embodiment of the application, said "starting from the leaf node, moving, according to an address stored in address bits of each layer of subtree node, data stored in the leaf node to data bits of the upper layer of subtree node, until data corresponding to the address is output at a subtree node at the root of the binary tree structure" comprises:

starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the basic circuit structure.

In one embodiment of the application, the method further includes, after data corresponding to the address is output at a subtree node at the root of the binary tree structure:

executing uncomputing on the QRAM structure to restore the QRAM structure to its initial state.

In one embodiment of the application, data stored in the leaf node is a multi-bit number, wherein parent nodes of leaf nodes corresponding to each bit of the multi-bit number are all different; or data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

Another embodiment of the present application provides a data reading device, applied to a pre-constructed QRAM architecture for accessing data, wherein the QRAM architecture is a binary tree structure and comprises the following nodes: N layers of subtree node and one layer of leaf node, the subtree node comprising address bits and first data bits, and the leaf node comprising second data bits for storing data, the N being an address length, the device including:

a receiving module, configured for receiving the address represented by a quantum state;

a parsing module, configured for: parsing the address, and moving each bit of the address respectively to address bits of subtree node of a corresponding layer; wherein each one bit of the address corresponds to one respective layer of the N layers of subtree node.

an outputting module, configured for: starting from the leaf node, moving, according to an address stored in address bits of each layer of subtree node, data stored in the leaf node to data bits of the upper layer of subtree node, until data corresponding to the address is output at a subtree node at the root of the binary tree structure.

Another embodiment of the present application provides a storage medium having a computer program stored therein, wherein the computer program is configured to perform during execution thereof the method of any one of the above embodiments.

Another embodiment of the present application provides an electronic device, including: a memory having a computer program stored therein, and a processor, configured to execute the computer program to perform the method of any one of the above embodiments.

The present application will be further described in conjunction with the embodiments and accompanying drawings.

DETAILED DESCRIPTION

The exemplary embodiments described below with reference to the accompanying drawings are intended only to explain the present application, and are not to be construed as restriction thereto.

First of all, an embodiment of the present application provides a method for reading data based on address, which can be applied to electronic equipment, such as a computer terminal, specifically an ordinary computer, a quantum computer, and the like.

Figure 1:
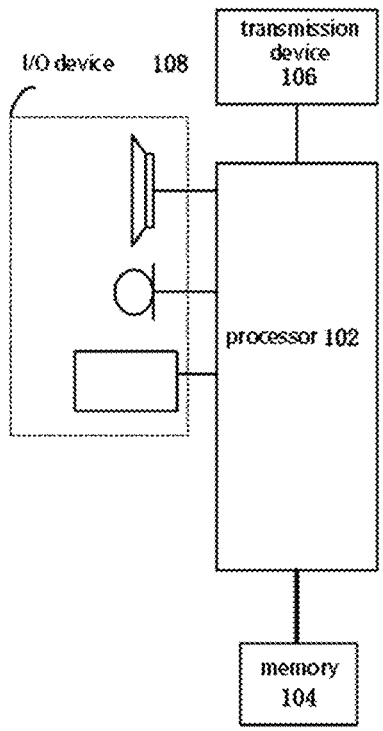
FIG. 1 is a block diagram of a hardware structure of a computer terminal for a method for reading data based on address provided in an embodiment of the present application.

The following will describe the embodiments in detail, using operation thereof on a computer terminal as an example. FIG. 1 is a block diagram of a hardware structure of a computer terminal for a method for reading data based on address provided in an embodiment of the present application. As shown in FIG. 1, a computer terminal may include one or more (only one is shown in FIG. 1) processor 102 (a processor 102 may include but not limited to processing devices such as microprocessors MCUs or programmable logic devices FPGAs) and a memory 104 for storing data. Optionally, the above-mentioned computer terminal may further include a transmission device 106 for communication functions, and an I/O (input/output) device 108. Those skilled in the art can understand that the structure shown in FIG. 1 is only for illustration, and constitutes no limitation to the structure of the above computer terminal. For example, the computer terminal may also include more or fewer components than shown in FIG. 1, or have a configuration different from that shown in FIG. 1.

The memory 104 can be used for storing software programs and modules of application software, such as program instructions/modules corresponding to the method for reading data based on address in an embodiment of the present disclosure. By running software programs and modules stored in the memory 104, the processor 102 executes various functional applications and data processing, i.e., to implement the above-mentioned method. The memory 104 may include a high-speed random-access memory, and may also include non-volatile memories, such as one or more of magnetic storage devices, flash memory, or other non-volatile solid-state memories. In some examples, the memory 104 may further include a memory that is remotely located relative to the processor 102, and these remote memories may be connected to a computer terminal through a network. Examples of the aforementioned networks include, but are not limited to, the Internet, intranets, local area networks, mobile communication networks, and combinations thereof.

The transmission device 106 is used for receiving or transmit data via a network. A specific example of the above-mentioned network may include a wireless network provided by a communication provider of the computer terminal. In one example, the transmission device 106 includes a network adapter (Network Interface Controller, NIC), which can be connected to other network devices through a base station so as to communicate with the Internet. In one example, the transmission device 106 may be a radio frequency (Radio Frequency, RF) module, which is used for communicating with the Internet in a wireless manner.

It is to be noted that a real quantum computer is of a hybrid structure, which consists of two parts: one is a classical computer, which functions to execute classical computing and control; the other is a quantum device, which functions to run quantum programs and implementing quantum computing. A quantum program is a series of instruction sequences written in a quantum language such as Qrunes that can be run on a quantum computer, which supports quantum logic gate operations and ultimately realizes quantum computing. Specifically, a quantum program is a series of instruction sequences that operate quantum logic gates in a certain sequence.

In practical applications, due to the limitation of the development of quantum device hardware, quantum computing simulations are usually required to verify quantum algorithms, quantum applications, etc. Quantum computing simulation is the process of simulating the operation of quantum programs corresponding to specific problems using a virtual architecture (that is, a quantum virtual machine) built with the resources of ordinary computers. Typically, quantum programs corresponding to specific problems need to be constructed. The quantum program referred to in the embodiment of the present disclosure is a program written in a classical language to characterize qubits and their evolution, in which qubits, quantum logic gates, etc. related to quantum computing all have expressions with corresponding classical codes.

As an embodiment of quantum programs, quantum circuits, also known as quantum logic circuits, are the most commonly used general-purpose quantum computing models, which means circuits that operate on qubits under abstract concepts: components thereof include qubits, circuits (timelines), and various quantum logic gates; and results thereof usually need to be read out through quantum measurement operations.

Unlike traditional circuits, which are connected by metal wires to transmit voltage signals or current signals, in quantum circuits, the circuits can be regarded as connected by time, that is, the state of qubits evolves naturally with time. In this process, it follows the instruction of the Hamiltonian operator, and is operated upon its encounter with a logic gate.

A quantum program corresponds to a total quantum circuit as a whole, and the quantum program described in the application refers to this total quantum circuit, wherein, the total number of qubits in the total quantum circuit and the total number of qubits of the quantum program same. It can be understood as: a quantum program can be composed of quantum circuits, measurement operations for qubits in quantum circuits, registers for saving measurement results, and control flow node (jump instructions). A quantum circuit can contain tens, hundreds or even thousands of Tens of thousands of quantum logic gate operations. The execution process of a quantum program is the process of executing all quantum logic gates according to a certain time sequence. It should be noted that timing refers to the time sequence in which a single quantum logic gate is executed.

It is to be noted that in classical computing, the most basic unit is a bit, and the most basic control mode is a logic gate. With a combination of logic gates, the purpose of controlling a circuit can be achieved. Similarly, the means by which to handle qubits is quantum logic gates. The use of quantum logic gates can make the quantum state evolve. Accordingly, quantum logic gates are the basis of quantum circuits. Quantum logic gates include single-bit quantum logic gates, such as Hadamard gates (H gates), Pauli-X gates (X-gates), Pauli-Y gates (Y-gates), Pauli-Z gates (Z-gates), RX gates, RY gates, RZ gates; multi-bit quantum logic gates such as CNOT gates, CR gates, iSWAP gates, Toffoli gates. Quantum logic gates are generally represented by unitary matrices, which are not only in the form of matrices but also a certain kind of operation and transformation. Generally, a quantum logic gate functions on a quantum state is to compute by a unitary matrix left-multiplied by a matrix corresponding to the right vector of the quantum state.

A QRAM is a memory system for quantum computers, and is a quantum version of a classical computer RAM. A QRAM can be used for creating a quantum superposition state containing information. In contrast to a RAM which needs to read data one by one, a QRAM can read superimposed data with a superposition address. For example, to store $e\_0, e\_1, \ldots, e\_(n-1)$ in the address $[0, N)$: if you use a classical RAM, input the address i, and output the data $e\_i$; if you use a quantum version of the classical RAM, i.e., a QRAM, you can input the following quantum state as the address:

$$\Sigma|i\rangle$$

Obtain following output using QRAM:

$$\Sigma|i\rangle e_i\rangle$$

Such a process of inputting an address and outputting data may be called a "query" or an "access".

QRAMs have been playing the role of classical data to quantum data conversion (as an intermediate memory for classical data to be converted into quantum data) in various quantum algorithms. An important prerequisite for these algorithms to enable quantum acceleration is exactly that there cannot be too long time for QRAM to execute a "query". Specifically, if the problem size is N, then a generally acceptable query time should be O(1) or O(polylog N), rather than O(N).

ORAMs have many possible physical implementations, such as "the earliest proposed" optical systems, and later proposed acoustic systems.

All of these systems are likely to realize a QRAM with O(polylog N) access time, which can be considered as a valid solution. Regarding a QRAM, this application proposes a QRAM physical architecture based on the Nearest-neighbor premise.

No specific physical system has been required for implementation of such a QRAM architecture. It can be implemented in physical systems that have been proven to be possible for quantum computing, such as optics, semiconductor quantum dots, superconducting circuits, ion traps, etc.

Figure 2:
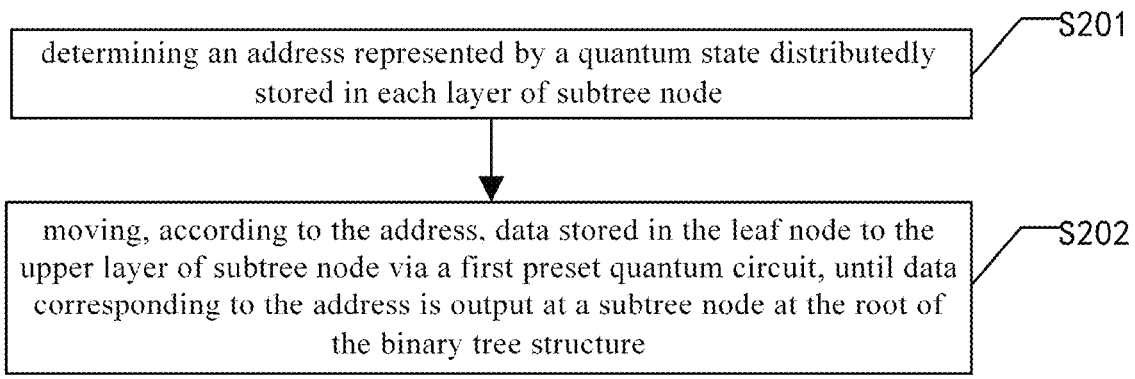
FIG. 2 is a schematic flowchart of a method for reading data based on address provided in an embodiment of the present application.

Referring to FIG. 2, FIG. 2 is a schematic flow diagram of a method for reading data based on address provided in an embodiment of the application, applied to a pre-constructed quantum random access memory (QRAM) architecture for accessing data, wherein the QRAM architecture is a binary tree structure and comprises the following nodes: N layers of subtree node and one layer of leaf node, the N being an address length;

The method for reading data based on address may include the following steps:

S201, determining an address represented by a quantum state distributedly stored in each layer of subtree node;

Specifically, the subtree node may include address bits and first data bits, and the leaf node include second data bits for storing data. In addition, the method may further include determining an address represented by a quantum state in address bits distributedly stored in each layer of subtree node, wherein one layer of subtree node corresponds to one bit of address.

Figure 3:
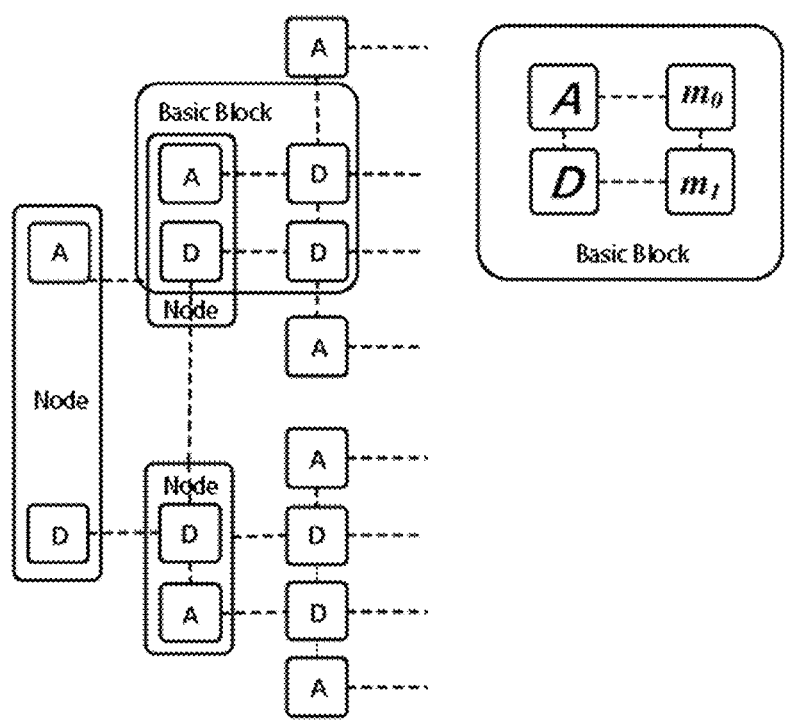
FIG. 3 is a schematic architectural illustration of a QRAM provided in an embodiment of the present application.

In contrast to the prior art, this application provides a method for reading data based on address, applied to a pre-constructed quantum random access memory (QRAM) architecture for accessing data, wherein the QRAM architecture is a binary tree structure and comprises the following nodes: N layers of subtree node and one layer of leaf node, the N being an address length. Firstly, an address represented by a quantum state distributedly stored in each layer of subtree node is determined. Then, according to the address, data stored in the leaf node is moved to the upper layer of subtree node via a first preset quantum circuit, until data corresponding to the address is output at a subtree node at the root of the binary tree structure. It can be seen that, with a valid QRAM architecture proposed, the function of storing an address in the form of a quantum state and reading data can be realized, thereby speeding up analysis and verification of a complex quantum algorithm. Specifically, a pre-constructed complete QRAM may exhibit a binary tree structure. As shown in FIG. 3, each small block in the figure represents a Qubit (quantum bit), and there are two types of Qubits: A-bit, i.e., address bit (Address Qubit); D-bit, i.e., data bit (Data Qubit). An A-bit and a D-bit vertically adjacent thereto constitute a group called a "node", which is a basic unit in a binary tree. A binary tree consists of all the nodes thereof. The root of the binary tree is the output part of the QRAM. Each leaf node (the last layer, not shown in the figure) records one binary data bit. A Basic Block is a basic circuit structure spanning two layers, consisting of one node and D-bits (respectively referred to as m0 and m1) in its two child nodes, with a total of 4 bits.

For a QRAM with an address length of N (such as typical data word lengths, 32 bits, 64 bits, etc.), the maximum addressing space of the QRAM is from 0 to $2^N-1$. Such a QRAM has a total of N layers of subtree node plus the last one layer of leaf node, wherein the leaf nodes at the last one layer can store up to $2^N$ binary bits. Of course, the definition thereof may be expanded according to the "byte" (1 byte=8 bits) of classical computers in the prior art, where $2^{(3+N)}$ binary bits need to be stored for an N-bit QRAM, corresponding to a binary tree with the height of 3+N.

Initialization of a QRAM architecture is necessary before operation thereof. The initialization is actually a data importing process of the QRAM, during which the data is imported into the leaf nodes one by one and then correspondingly read out as required according to receiving addresses.

In practical application, before determining the address that is distributedly stored in the quantum state representation of every layer of subtree node, the address represented by the quantum state may also be received and parsed, then each bit of the address is distributedly stored on address bits of the subtree node of a corresponding layer.

Specifically, for each bit of the address, starting from k=N, the k-th bit of the address may be moved to the first layer of subtree node at the root of the binary tree structure; wherein, the k-th bit of the address may be moved to a data bit of the first layer of subtree node;

Starting from the first layer of subtree node, execute repeatedly the step of moving the k-th bit of the address in the current layer of subtree node to the lower layer of subtree node, until it is moved to the address bits of the subtree node of the k-th layer, wherein the k is a positive integer taking values sequentially from N to 1, thereby realizing propagation of an address.

Alternatively, starting from k=1, the k-th bit of the address is moved to the first layer of subtree node at the root of the binary tree structure. Starting from the first layer of subtree node, execute repeatedly the step of moving of the k-th bit of the address in the current layer of subtree node to the lower layer of subtree node, until it is moved to the address bits of the subtree node of the (N−k+1)-th layer, wherein the k is a positive integer taking values sequentially from 1 to N.

In one of the embodiments, after moving the k-th bit of the address in the current layer of subtree node to the lower layer of subtree node, immediately move a bit of the address next to the k-th bit of the address from the upper layer of subtree node to the current layer of subtree node.

In one implementation, first, determine a basic circuit structure in the binary tree structure, which basic circuit structure includes: address bits and data bits of one subtree node, and data bits of two child nodes in the lower layer;

starting from the first layer of subtree node, executing repeatedly a second preset quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node;

swapping the quantum state of the data bits of the subtree node of the k-th layer with the quantum state of the address bits of the subtree node, so as to move the k-th bit of the address to the address bit of the subtree node of the k-th layer.

In a practical application, when a quantum address is handed down to the QRAM, the QRAM receives and then parses the address, and then writes address information into an A-bit in the entire architecture. For a binary tree with a height of N (the number of layers of subtree nodes), first of all, starting from the root thereof, move the N-th bit in the N-bit address to the D qubit, and move the value in the D-bit to m0 and m1. Afterwards, for Basic Blocks containing m0 or m1, respectively, the value in the D-bit is moved to the m0 and m1 of the next lower layer, until it is moved to the D-bit of the subtree node of the last layer, that is, the N-th layer. Finally, by swapping values of A and D, the address data is moved from the D-bit to the A-bit. The next step is to move the (N−1)-th bit to the (N−1)-th layer, . . . , until the $1^{st}$ bit is moved to the $1^{st}$ layer.

In one of the embodiments, the process can be performed in a "staggered" way as follows: when an address bit has been moved from the $1^{st}$ layer to the $2^{nd}$ layer, a process of moving the next address bit to the Pt layer is started immediately, so that the time length required for the entire step of moving will not exceed the time length for the N-th bit address to be moved to the N-th layer.

Figure 4:
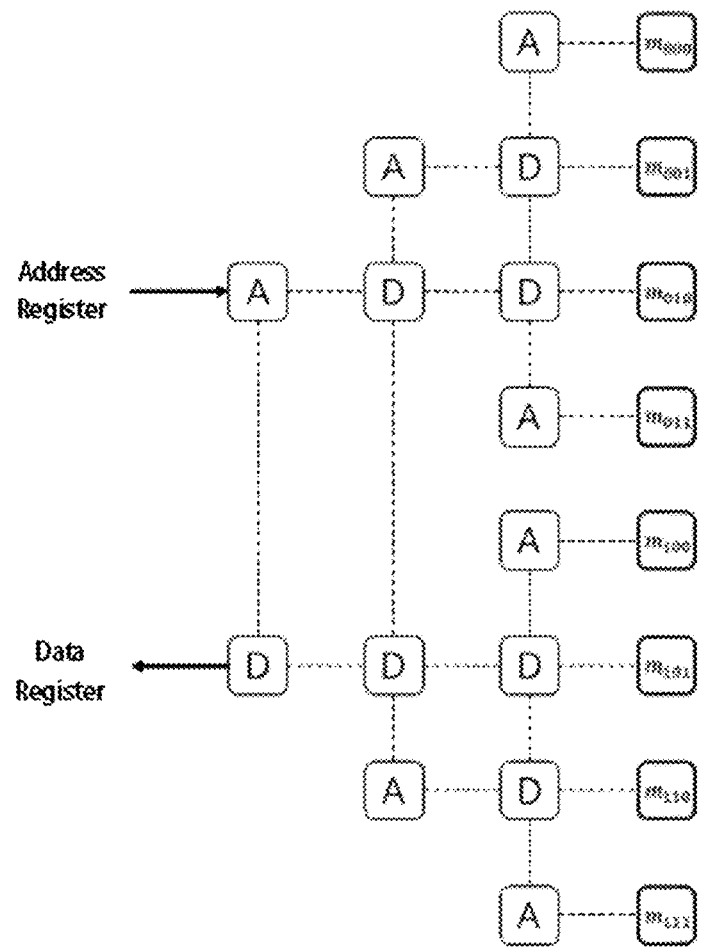
FIG. 4 is a schematic architectural illustration of a 3-subtree-layer QRAM provided in an embodiment of the present application.

FIG. 4 exemplarily shows the topology of a QRAM architecture, which includes 3 layers of subtree nodes and 1 layer of leaf nodes. Qubits in each initial subtree node may be set to the 0 state, where m000, m001 . . . m111 are data stored in the leaf node. The leaf node may include a data bit (that is, the second data bit), whose type may be qubit or classical bit. An Address Register represents an address bit; a Data Register represents a data bit.

Due to the superposition characteristics of quantum, a quantum state is a superposition state of one group of eigenstates, for example: a 3-bit quantum state $|f\rangle = b_0|000\rangle + b_1|001\rangle + b_2|010\rangle + b_3|011\rangle + b_4|100\rangle + b_5|101\rangle + b_6|110\rangle + b_7|111\rangle$, wherein $|000\rangle$, $|001\rangle$, . . . , $|111\rangle$ are eigenstates, the number is 2 to the power of 3, and wherein b0 . . . b7 represents the amplitude (probability amplitude), satisfying $|b_0|^2+|b_1|^2+|b_2|^2+|b_3|^2+|b_4|^2+|b_5|^2+|b_6|^2+|b_7|^2=1$, wherein the $|\rangle$ is the Dirac symbol. It is in a determined state when probability amplitudes of other states are all 0.

Assuming a received quantum state address $|f\rangle=|101\rangle$, from right to left thereof is the $3^{rd}$ bit to the $1^{st}$ bit, the amplitude of $|101\rangle$ being 1. First of all, move the $3^{rd}$ bit address "1" to the D-bit of the first layer of subtree node, execute a second preset quantum circuit corresponding to a Basic Block spanning the first layer and the second layer, and move the address "1" to two D-bits in the second layer. Next, execute a second preset quantum circuit corresponding to two Basic Blocks spanning the second layer and the third layer, and then move the address "1" to the 4 D-bits in the third layer. Finally, you may use a SWAP gate or an equivalent quantum logic gate to swap the quantum states of the A-bit(s) and the D-bit(s) located in the same subtree node, and move the address "1" to the four A-bits in the third layer. At this time, the quantum state of the four 4 A-bits in the third layer is "1" state.

Figure 5:
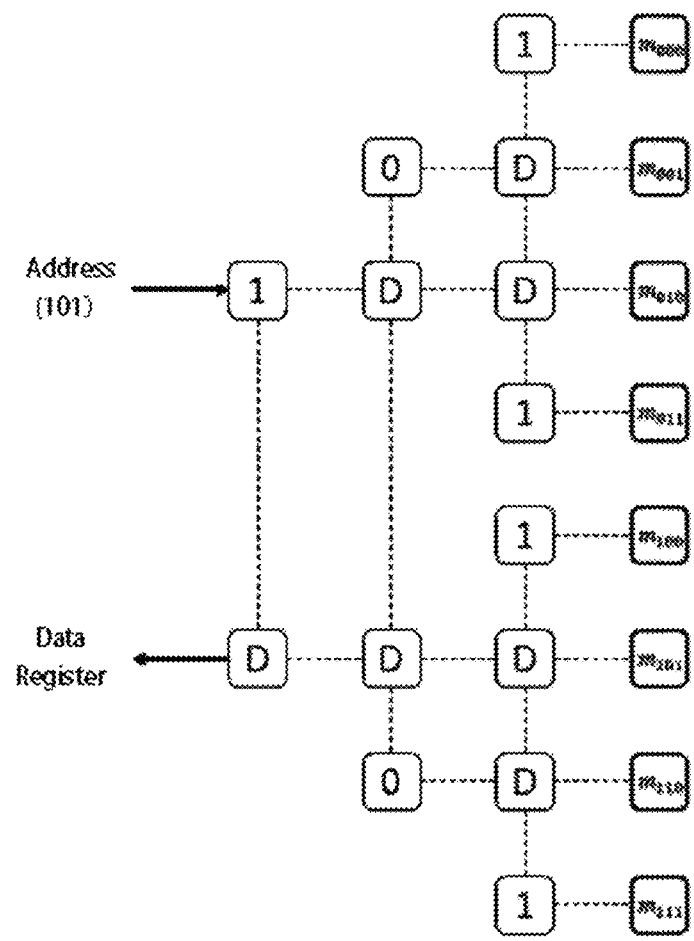
FIG. 5 is a schematic architectural illustration of another 3-subtree-layer QRAM provided in an embodiment of the present application.

For the same reason, the $2^{nd}$ bit "0" of the address is finally moved to two A-bits in the $2^{nd}$ layer, and the $1^{st}$ bit "1" of the address is finally moved to one A-bit in the $2^{nd}$ layer. Finally, the result as shown in FIG. 5 is achieved, where the address $|101\rangle$ is propagated onto the A-bits of layers 1 to 3. In one embodiment, the propagation process can be performed in a staggered manner, for example, when the $3^{rd}$ address bit "1" is moved from layer 2 to layer 3, the next address bit "0" is moved from layer 1 to layer 2 at the same time.

S202, moving, according to the address, data stored in the leaf node to the upper layer of subtree node via a first preset quantum circuit, until data corresponding to the address is output at a subtree node at the root of the binary tree structure.

Specifically, starting from the leaf node, the data stored in the leaf node may be moved to data bits of the upper layer of subtree node via a first preset quantum circuit;
continuing to move, data stored in data bits of subtree node in the current layer to data bits of the upper layer of subtree node via the first preset quantum circuit, until data corresponding to the address is obtained and output at data bits of subtree node at the root of the binary tree structure;
wherein the first preset quantum circuit corresponds to a basic circuit structure in the binary tree structure, the basic circuit structure including address bits and data bits of one subtree node and data bits of two child nodes in the lower layer of the one subtree node, the data moved to a data bit of the subtree node in the upper layer is determined from the address stored in address bits in the basic circuit structure.

This process may be called "data copy". Now, starting from the leaf node of the leaf part, a basic circuit structure of each Basic Block executes a corresponding first preset quantum circuit. Execution on each layer is carried out immediately before execution on the lower layer thereof. The function of the first preset quantum circuit is to move data from a child node to a parent node. Since the address is stored in the A-bit, the data moving process of each layer must retain the correct data required. Therefore, what moved to the D-bits of the subtree node at the root is definitely the data bit indicated by the address, thereby successfully extracting the data.

Exemplarily, continue to take FIG. 5 as an example, which shows that an address 101 is stored. At this time, two leaf nodes and a subtree node of the upper layer constitute a basic circuit structure. First preset quantum circuits corresponding to 4 Basic Blocks spanning the third layer and the leaf layer are simultaneously executed. Here, in the first Basic Block from the top, since the "A" of the parent node is the third bit "1" of the address, the data m001 (the third bit of the subscript of the data is "1") in the two child nodes is moved to the "D" of the parent node. Similarly, in the second, third, and fourth Basic Blocks, the data being moved are m011, m101, and m111. Finally, the D-bits of the subtree nodes in the third layer reads out four data m001, m011, m101, and m111, wherein the third bits of the subscripts of these data are all "1" (corresponding to the third bit "1" of the written address 101).

Next, first preset quantum circuits corresponding to the two Basic Blocks spanning the second layer and the third layer are executed. Here, in the first Basic Block above, since the "A" of the parent node is the second bit "0" of the address, the data m001 (the second bit of the subscript of the data is "0") in the two child nodes is moved to the "D" of the parent node. Similarly, in the second Basic Block, the data to be moved is m101. Finally, the D-bits of the subtree nodes in the second layer reads out two data m001 and m101, wherein the second bits of the subscripts of these data are "0" (corresponding to the second bit "0" of the written address 101).

Figure 6:
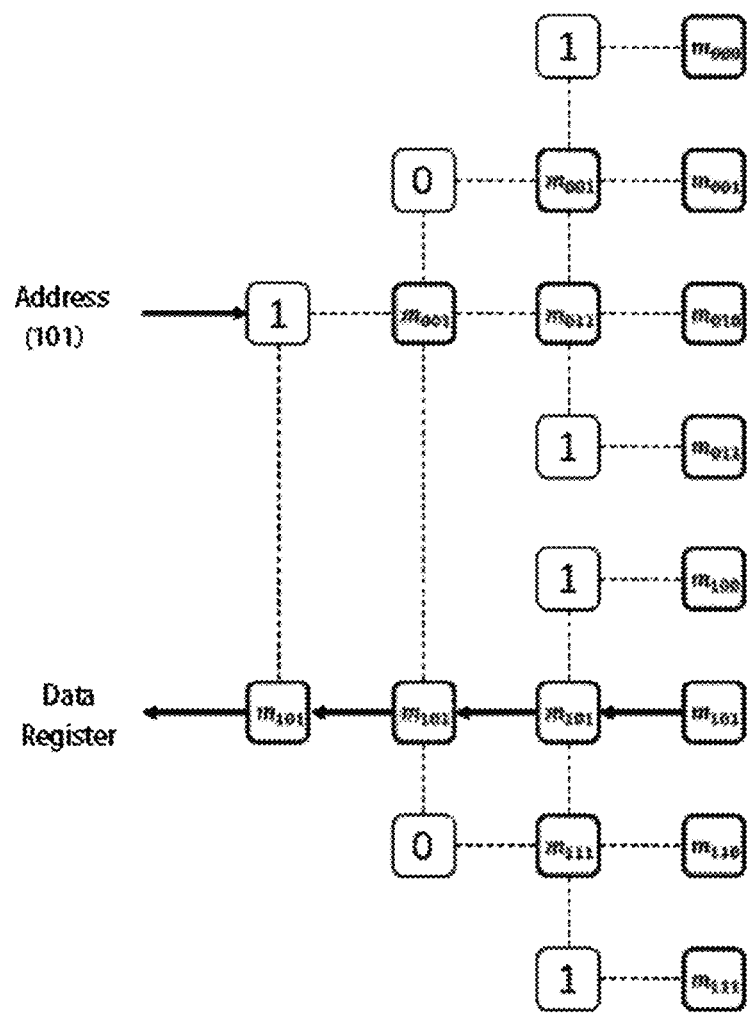
FIG. 6 is a schematic architectural illustration of another 3-subtree-layer QRAM provided in an embodiment of the present application.

Finally, a first preset quantum circuit corresponding to a Basic Block spanning the first layer and the second layer is executed. Here, since the "A" of the parent node is the first bit "1" of the address, the data m101 (the first bit of the subscript of the data is 1) in the two child nodes is moved to the "D" of the parent node. Finally, the D-bits of the subtree nodes at the root in the first layer reads out two data m101, wherein the second bits of the subscripts of these data are "1" (corresponding to the first bit "1" of the written address 101), thereby realizing reading and outputting of the data m101 which corresponds to the quantum state address |101>, as shown in FIG. 6.

In one specific implementation, one Basic Block requires two types of basic quantum circuits, which two types are called "sub-circuit a" (corresponding to the second preset quantum circuit) and "sub-circuit b" (corresponding to the first preset quantum circuit)

Figure 7A:
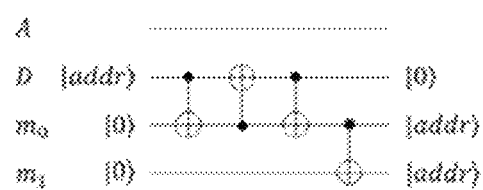
FIG. 7 is a schematic diagram of a basic quantum circuit that implements the basic circuit structure provided in an embodiment of the present application.

The "sub-circuit a" is as shown in FIG. 7(a). Its function does not involve any A-bit: it moves the address data "addr" in the D-bits into m0 and m1. Before running this circuit, the quantum states in m0 and m1 are both guaranteed to be 0 state. After running this circuit, the states in the D-bits are guaranteed to be 0 state. Here, this circuit uses 4 CNOT gates, which in FIG. 7(a) are indicated by a "a" icon on one bit plus a connection line connecting another bit.

Figure 7B:
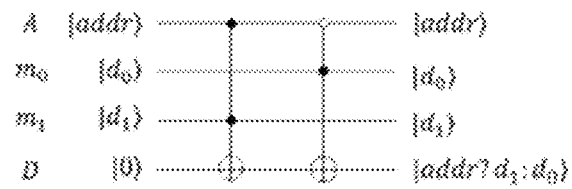

The "sub-circuit b" is as shown in FIG. 7(b). Its function is to selectively move the data of m0 or m1 to the D-bit of the upper layer, according to the address data "addr" of the A-bit. In the case that A is 0, move the data "d0" of m0 (corresponding subscript is 0) to D-bits through the Toffoli gate; otherwise, in the case that A is 1, move the data "d1" of m1 (corresponding subscript is 1) to D-bits through the Toffoli gate. In the case that the positions of m0 and m1 are swapped, the functions thereof remain the same: that is, in the case that A is 0, the data of m0 is moved to the D-bits; in the case that A is 1, the data of m1 is moved to the D-bits. In FIG. 7(b), the Toffoli gate is represented by a "⊕" icon on one bit plus connection lines connecting another two bits, wherein a solid center of the icon indicates actual control, i.e., to execute the quantum logic gate when the quantum state of the bit is 1; and wherein a hollow center of the icon indicates virtual control, i.e., to execute the quantum logic gate when the quantum state of the bit is 0.

Figure 7C:
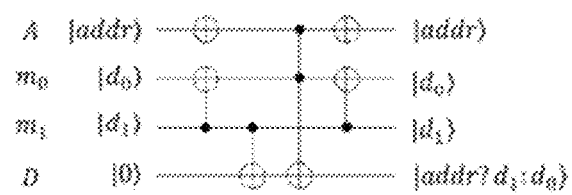

In addition, in one of the embodiments, a "sub-circuit c" implements the same function as the "sub-circuit b". By contrast, as shown in FIG. 7(c), the sub-circuit c uses only one Toffoli gate, three CNOT gates and two NOT gates, which are relatively optimized (as the implementation of a Toffoli gate is very complicated), and can be used as equivalent alternatives. Here, a "⊕" icon on one bit indicates a NOT gate. It should be noted that this is not a specific limitation on construction of the basic quantum circuit required by the Basic Block: other quantum circuits that can realize the functions of "sub-circuit a" and "sub-circuit b" also fall within the scope of protection of this application. To complete one aforementioned propagation, "sub-circuit a" needs to be executed N times, a required time therefor is 4Nt, where "t" is the time required for execution of one CNOT gate. To complete one data copy, the sub-circuit c needs to be executed for N times, a required time therefor is 3Nt+Nt', where t' is the time required for a Toffoli gate.

Specifically, in a practical application, after outputting the data corresponding to the address at the subtree node of the root of the binary tree structure, uncomputing can be executed on the QRAM architecture, so as to restore the QRAM architecture to its original state.

Although the entire system architecture has taken out the data, it has not yet restored the original state. Restoring the original state is very important, because a query in a quantum algorithm often needs to be executed many times. Accordingly, our uncomputing process is to perform the data copy and propagation process in a reversed way, so as to restore the whole system to its original state. The total computing time required is N(14t+2t').

Specifically, the data stored in the leaf node includes a multi-bit number, wherein parent nodes of each leaf node corresponding to each bit of the multi-bit number are all different.

Alternatively, the data stored in the leaf node includes a plurality of multi-bit numbers, wherein continuous storage is executed for identical bits of the plurality of multi-bit numbers, and parent nodes of each one leaf node corresponding to each one bit of each multi-bit number are all different.

For the storage and reading of multi-bit data, the same architecture as before and a new memory storage method can be adopted. That is, when a multi-bit number needs to be stored, each bit of this number can be distributed to a different location for storage, so that parent nodes of each one leaf node corresponding to each one bit of the multi-bit number are all different. If 1024 64-bit floating-point numbers are to be stored, you only need to store all the 0-th bit of these 1024 numbers, and then store all the $1^{st}$ bits, ..., so that parent nodes of each one leaf node corresponding to each one bit of the multi-bit number are all different.

When reading, due to the parallel characteristics of quantum, starting from the last layer of nodes, in the first $\log_2(1024)=10$ steps, each bit of the multi-bit number can be taken out in parallel, because each one bit of the multi-bit number is in a different Basic Block. Accordingly, all the numbers you want are obtained on $(\log_2(64)=6)$-th layer. Then, these data are taken out in turn. Finally, the uncomputing process is accomplished. Therefore, storing data in this way may realize simultaneous parallel processing of all bits of all numbers, realizing a certain acceleration effect as compared with continuous storage. Here, "continuous storage" means to continuously store the 0-th bit to the last bit of one number, and then continuously store the 0-th bit to the last bit of another number, and so on.

It can be seen that by proposing a valid design of a QRAM physical architecture which may be realized in an ideal noise-free physical system and has demands for planar and nearest neighbor interaction, which demands are only on the arrangement of qubits. Such a QRAM does not exceed the order of O(log(N)) in the running time length thereof, and therefore it can fully meet the demands of quantum algorithms. Moreover, a quantum circuit based on a QRAM only uses the most basic quantum logic gates that can be realized reasonably, so as to realize the function of storing an address and reading data in the form of quantum states, and to speed up the analysis and verification of complex quantum algorithms.

Figure 8:
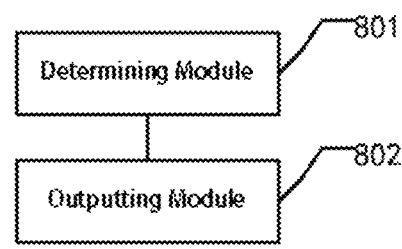
FIG. 8 is a schematic architectural illustration of a device for reading data based on address provided in an embodiment of the present application.

Referring to FIG. 8, which is a schematic architectural illustration of a device for reading data based on address as provided in the embodiment of the present application, the device is applied to a pre-constructed QRAM architecture for accessing data, wherein the QRAM architecture is a binary tree structure and comprises the following nodes: N layers of subtree node and one layer of leaf node, the N being an address length; the device including:

a determining module 801, configured for determining an address represented by a quantum state distributedly stored in each layer of subtree node;

an outputting module 802, configured for moving, according to the address, data stored in the leaf node to the upper layer of subtree node via a first preset quantum circuit, until data corresponding to the address is output at a subtree node at the root of the binary tree structure.

Specifically, the subtree node includes: address bits and first data bits, and the leaf node comprise second data bits for storing data;

The determining module is specifically configured for:
determining an address represented by a quantum state in address bits distributedly stored in each layer of subtree node; wherein one layer of subtree node corresponds to one bit of address.

The outputting module specifically includes:
a data moving unit, configured for: starting from the leaf node, moving data stored in the leaf node to data bits of the upper layer of subtree node via a first preset quantum circuit,
a data output unit, configured for: continuing to move, data stored in data bits of subtree node in the current layer to data bits of the upper layer of subtree node via the first preset quantum circuit, until data corresponding to the address is obtained and output at data bits of subtree node at the root of the binary tree structure; wherein the first preset quantum circuit corresponds to a basic circuit structure in the binary tree structure, the basic circuit structure comprising address bits and data bits of one subtree node and data bits of two child nodes in the lower layer of the one subtree node, the data moved to a data bit of the subtree node in the upper layer is determined from the address stored in address bits in the basic circuit structure.

Specifically, the device also includes:
a receiving and storing module, configured for: receiving the address represented by a quantum state; parsing the address; and storing distributedly each bit of the address into address bits of subtree node of a corresponding layer.

Specifically, the receiving and storing module further includes:
a first moving unit, configured for: for each bit of the address, starting from k=N, moving the k-th bit of the address to the first layer of subtree node at the root of the binary tree structure;
a second moving unit, configured for: starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

Specifically, the receiving and storing module further includes:
a third moving unit, configured for: for each bit of the address, starting from k=1, moving the k-th bit of the address to the first layer of subtree node at the root of the binary tree structure;
a fourth moving unit, configured for: starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;
wherein, after moving the k-th bit of the address in the current layer of subtree node to the lower layer of subtree node, moving a bit of the address next to the k-th bit of the address from the upper layer of subtree node to the current layer of subtree node.

Specifically, the first moving unit is in particular configured for:
moving the k-th bit of the address to data bits of the first layer of subtree node at the root of the binary tree structure;

The second moving unit is in particular configured for:
starting from the first layer of subtree node, executing repeatedly a second preset quantum circuit corresponding to the basic circuit structure in the binary tree structure, so as to move the k-th bit of the address stored in data bits of the subtree node in the basic circuit structure to data bits of two child nodes in the lower layer, until the k-th bit of the address is moved to a data bit of the k-th layer of the subtree node,
swapping the quantum state of the data bits of the subtree node of the k-th layer with the quantum state of the address bits of the subtree node, so as to move the k-th bit of the address to the address bit of the subtree node of the k-th layer.

Specifically, the device also includes:
an uncomputing module, configured for executing uncomputing on the QRAM structure to restore the QRAM structure to its initial state.

Specifically, data stored in the leaf node is a multi-bit number, wherein parent nodes of leaf nodes corresponding to each bit of the multi-bit number are all different; or
data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

It can be seen that by proposing a valid QRAM architecture, the function of storing an address in the form of a quantum state and reading data can be realized, thereby speeding up the analysis and verification of complex quantum algorithms.

An embodiment of the present application also provides a storage medium having a computer program stored therein, wherein the computer program is configured to perform during execution thereof the method of any one of the method embodiments above.

Specifically, in the present embodiment, the above-mentioned storage medium may be configured to store a computer program for executing the following steps:
S1: determining an address represented by a quantum state distributedly stored in each layer of subtree node;
S2: moving, according to the address, data stored in the leaf node to the upper layer of subtree node via a first preset quantum circuit, until data corresponding to the address is output at a subtree node at the root of the binary tree structure.

Specifically, in this embodiment, the above-mentioned storage medium may include but not limited to: U disk, Read-Only Memory (referred to as ROM), Random Access Memory (referred to as RAM), mobile hard disk, magnetic disk or optical disk and other media that can store computer programs.

An embodiment of the present application also provides an electronic device, including: a memory having a computer program stored therein, and a processor, configured to execute the computer program to perform the method of any one of the method embodiments as mentioned above.

Specifically, the electronic device may further include a transmission device and an I/O device, wherein the transmission device is connected to the processor, and the I/O device is also connected to the processor.

Specifically, in the present embodiment, the above-mentioned processor can be configured to perform, via a computer program, the following steps:

S1: determining an address represented by a quantum state distributedly stored in each layer of subtree node;

S2: moving, according to the address, data stored in the leaf node to the upper layer of subtree node via a first preset quantum circuit, until data corresponding to the address is output at a subtree node at the root of the binary tree structure.

Figure 9:
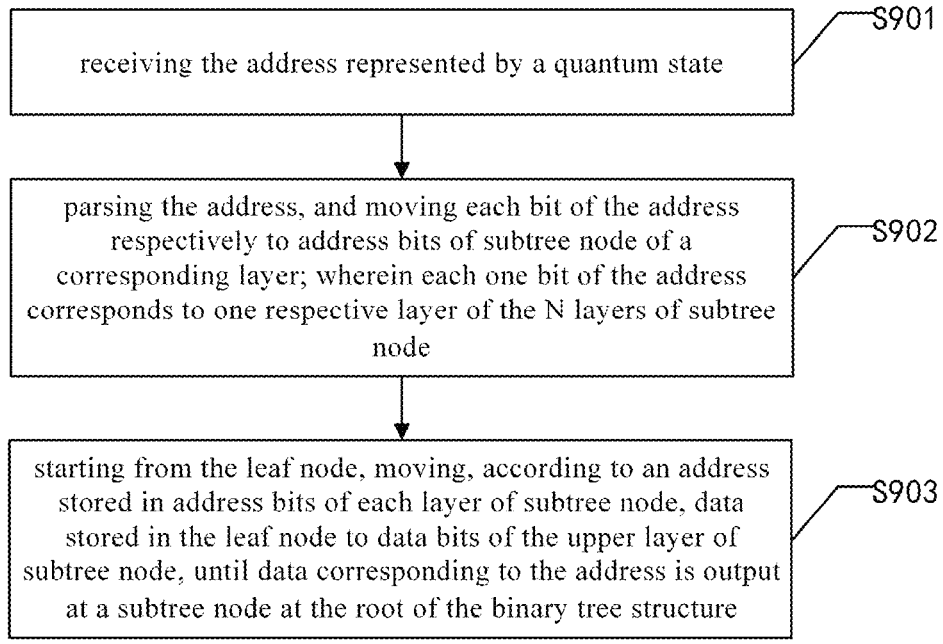
FIG. 9 is a schematic flow diagram of a data reading method provided in an embodiment of the present application.

In one embodiment of the present application, as shown in FIG. 9, which is a schematic flow diagram of a data reading method provided in an embodiment of the present application. The method is applied to a pre-constructed QRAM architecture for accessing data, wherein the QRAM architecture is a binary tree structure including the following nodes: N layers of subtree node and one layer of leaf node, the subtree node including address bits and first data bits, and the leaf node including second data bits for storing data, the N being an address length.

In contrast to the prior art, the present application provides a data reading method, applied to a pre-constructed QRAM architecture for accessing data, wherein the QRAM architecture is a binary tree structure including the following nodes: N layers of subtree node and one layer of leaf node, the subtree node including address bits and first data bits, and the leaf node including second data bits for storing data, the N being an address length. First of all, receive the address represented by a quantum state; then parse the address, and move each bit of the address respectively to address bits of subtree node of a corresponding layer; wherein each one bit of the address corresponds to one respective layer of the N layers of subtree node; then, starting from the leaf node, move, according to an address stored in address bits of each layer of subtree node, data stored in the leaf node to data bits of the upper layer of subtree node, until data corresponding to the address is output at a subtree node at the root of the binary tree structure. It can be seen that by proposing a valid QRAM architecture, the function of writing an address in the form of a quantum state and reading data can be realized, thereby speeding up analysis and verification of complex quantum algorithms.

Specifically, the entire QRAM may exhibit a binary tree structure. As shown in FIG. 3, each small block in the figure represents a Qubit. Qubits are categorized into two types: A-bits, i.e., address bits (Address Qubits); and D-bits, i.e., data bits (Data Qubits). An A-bit and a D-bit vertically adjacent thereto constitute a group called a "node", which is a basic unit in a binary tree. A binary tree consists of all the nodes thereof. The root of the binary tree is the output part of the QRAM. Each leaf node (the last layer, not shown in the figure) records one binary data bit. A Basic Block is a basic circuit structure spanning two layers, consisting of one node and D-bits (respectively referred to as m0 and m1) in its two child nodes, with a total of 4 bits.

For a QRAM with an address length of N (such as typical data word lengths, 32 bits, 64 bits, etc.), the maximum addressing space of the QRAM is from 0 to $2^N-1$. Such a QRAM has a total of N layers of subtree node plus the last one layer of leaf node, wherein the leaf nodes at the last one layer can store up to $2^N$ binary bits. Of course, the definition thereof may be expanded according to the "byte" (1 byte=8 bits) of classical computers in the prior art, where $2^{(3+N)}$ binary bits need to be stored for an N-bit QRAM, corresponding to a binary tree with the height of 3+N.

The data reading method may include the following steps:

S901, receiving the address represented by a quantum state;

In applications in the quantum field, a QRAM can be used to produce quantum superposition states containing information. Compared with a RAM, which needs to read in a "one-by-one" manner, a QRAM can read superimposed data with a superposition address. For example, to store e0, e1, ..., e(n−1) in the address [0, N): if the classical RAM is used, with the input of the address "i", the output of data "ei" is obtained; for the quantum version thereof "QRAM", the quantum state below may be input as the address:

$\Sigma |i\rangle$

The following output is obtained with QRAM:

$\Sigma |i\rangle |e_i\rangle$

Such a process of inputting an address and outputting data may be called a "query" or an "access".

Before reading data, initialization is required. This "initialization" is actually the writing process of a QRAM, during which data is imported one by one.

When a quantum address is handed down to the QRAM, the QRAM receives and then parses the address, and then writes address information into an A-bit in the entire architecture.

S902, parsing the address, and moving each bit of the address respectively to address bits of subtree node of a corresponding layer; wherein each one bit of the address corresponds to one respective layer of the N layers of subtree node; and Specifically, for each bit of the address, starting from k=N, you may move the k-th bit of the address to the first layer of subtree node at the root of the binary tree structure; wherein the k-th bit of the address may be moved to data bits of the first layer of subtree node.

Starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1. Accordingly, propagation of an address is realized.

Alternatively, starting from k=1, moving the k-th bit of the address to the first layer of subtree node at the root of the binary tree structure; starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N.

In one of the embodiments, after the k-th bit of the address in the current layer of subtree node is moved to the lower layer of subtree node, a bit next to the k-th bit of the address is immediately moved from the upper layer of subtree node to the current layer of subtree node.

In one implementation, first of all, a basic circuit structure in the binary tree structure may be determined. The basic circuit structure includes: address bits and data bits of one subtree node and data bits of two child nodes in the lower layer of the one subtree node;

starting from the first layer of subtree node, executing repeatedly a first basic quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node, swapping the quantum state of the data bits of the subtree node of the k-th layer with the quantum state of the address bits of the subtree node, so as to move the k-th bit of the address to the address bit of the subtree node of the k-th layer.

In practical applications, for a binary tree with the height of N (number of layers of subtree nodes), starting from the root, the N-th bit in the N-bits address is moved to the D-Qubit, and the value in D is moved to m0 and m1. Afterwards, for the basic block containing m0 or m1, respectively, the value in D is moved to m0 and m1 in the lower layer, until it is moved to the D-bit of the subtree node in the last layer, i.e., the N-th layer. Finally, data is moved from D to A-bit, by swapping the value of A with that of D. The next step is to move the (N−1)-th bit to the (N−1)-th layer . . . until the $1^{st}$ bit is moved to the $1^{st}$ layer.

In one of the embodiments, the process can be performed in a staggered way. When the address bit has been moved from the first layer to the second layer, the process of moving the next address bit to the first layer can be started immediately, so that the time length required for the entire moving step does not exceed the time for the N-th bit address to be moved to the N-th layer.

FIG. 4 exemplarily shows the topology of a QRAM architecture, which includes 3 layers of subtree nodes and 1 layer of leaf nodes. Qubits in each initial subtree node may be set to the 0 state, where m000, m001 . . . m111 are data stored in the leaf node. The leaf node may include a data bit, whose type may be qubit or classical bit. An Address Register represents an address bit; a Data Register represents a data bit.

Due to the superposition characteristics of quantum, a quantum state is a superposition state of one group of eigenstates, for example: a 3-bit quantum state $|f\rangle = b_0|000\rangle + b_1|001\rangle + b_2|010\rangle + b_3|011\rangle + b_4|100\rangle + b_5|101\rangle + b_6|110\rangle + b_7|111\rangle$, wherein $|000\rangle$, $|001\rangle$, . . . , $|111\rangle$ are eigenstates, the number is 2 to the power of 3, and wherein $b_0$ . . . $b_7$ represents the amplitude (probability amplitude), satisfying $|b_0|^2+|b_1|^2+|b_2|^2+|b_3|^2+|b_4|^2+|b_5|^2+|b_6|^2+|b_7|^2=1$, wherein the $|\rangle$ is the Dirac symbol. It is in a determined state when probability amplitudes of other states are all 0.

Assuming a received quantum state address $|f\rangle=|101\rangle$, from right to left thereof is the $3^{rd}$ bit to the $1^{st}$ bit, the amplitude of $|101\rangle$ being 1. First of all, move the $3^{rd}$ bit address "1" to the D-bit of the first layer of subtree node, execute a first basic quantum circuit (sub-circuit a) corresponding to a Basic Block spanning the first layer and the second layer, and move the address "1" to two D-bits in the second layer. Next, execute a first basic quantum circuit "a" corresponding to two Basic Blocks spanning the second layer and the third layer, and then move the address "1" to the 4 D-bits in the third layer. Finally, you may use a SWAP gate or an equivalent quantum logic gate to swap the quantum states of the A-bit(s) and the D-bit(s) located in the same subtree node, and move the address "1" to the four A-bits in the third layer. At this time, the quantum state of the four 4 A-bits in the third layer is "1" state.

For the same reason, the $2^{nd}$ bit "0" of the address is finally moved to two A-bits in the $2^{nd}$ layer, and the $1^{st}$ bit "1" of the address is finally moved to one A-bit in the $2^{nd}$ layer. Finally, the result as shown in FIG. 5 is achieved, where the address $|101\rangle$ is propagated onto the A-bits of layers 1 to 3. In one embodiment, the propagation process can be performed in a staggered manner, for example, when the $3^{rd}$ address bit "1" is moved from layer 2 to layer 3, the next address bit "0" is moved from layer 1 to layer 2 at the same time.

S903, starting from the leaf node, moving, according to an address stored in address bits of each layer of subtree node, data stored in the leaf node to data bits of the upper layer of subtree node, until data corresponding to the address is output at a subtree node at the root of the binary tree structure.

Specifically, starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the basic circuit structure.

This process may be called "data copy". Now, starting from the leaf node of the leaf part, a basic circuit structure of each Basic Block executes a corresponding second basic quantum circuit (sub-circuit b) Execution on each layer is carried out immediately before execution on the lower layer thereof. The function of the "sub-circuit b" is to move data from a child node to a parent node. Since the address is stored in the A-bit, the data moving process of each layer must retain the correct data required. Therefore, what moved to the D-bits of the subtree node at the root is definitely the data bit indicated by the address, thereby successfully extracting the data.

Exemplarily, continue to take FIG. 5 as an example, which shows that an address 101 is stored. At this time, two leaf nodes and a subtree node of the upper layer constitute a basic circuit structure. Second basic quantum circuits "c" corresponding to 4 Basic Blocks spanning the third layer and the leaf layer are simultaneously executed. Here, in the first Basic Block from the top, since the "A" of the parent node is the third bit "1" of the address, the data m001 (the third bit of the subscript of the data is "1") in the two child nodes is moved to the "D" of the parent node. Similarly, in the second, third, and fourth Basic Blocks, the data being moved are m011, m101, and m111. Finally, the D-bits of the subtree nodes in the third layer reads out four data m001, m011, m101, and m111, wherein the third bits of the subscripts of these data are all "1" (corresponding to the third bit "1" of the written address 101).

Next, a second basic quantum circuit "c" corresponding to the two Basic Blocks spanning the second layer and the third layer is executed. Here, in the first Basic Block above, since the "A" of the parent node is the second bit "0" of the address, the data m001 (the second bit of the subscript of the data is "0") in the two child nodes is moved to the "D" of the parent node. Similarly, in the second Basic Block, the data to be moved is m101. Finally, the D-bits of the subtree nodes in the second layer reads out two data m001 and m101, wherein the second bits of the subscripts of these data are "0" (corresponding to the second bit "0" of the written address 101).

Finally, a second basic quantum circuit "c" corresponding to a Basic Block spanning the first layer and the second layer is executed. Here, since the "A" of the parent node is the first bit "1" of the address, the data m101 (the first bit of the subscript of the data is 1) in the two child nodes is moved to the "D" of the parent node. Finally, the D-bits of the subtree nodes at the root in the first layer reads out two data m101, wherein the second bits of the subscripts of these data are "1" (corresponding to the first bit "1" of the written address 101), thereby realizing reading and outputting of the data m101 which corresponds to the quantum state address |101>, as shown in FIG. 6.

This process needs to execute the "sub-circuit c" for N times, and the required time=3Nt+Nt', where t' is the time length required for a Toffoli gate. The aforementioned execution of a propagation requires a time of 4Nt, where t is the time length required for the execution of a CNOT gate.

In one specific implementation, one Basic Block requires two types of basic quantum circuits, which two types are called "sub-circuit a" and "sub-circuit b".

The "sub-circuit a" is as shown in FIG. 7($a$). Its function does not involve any A-bit: it moves the address data "addr" in the D-bits into m0 and m1. Before running this circuit, the quantum states in m0 and m1 are both guaranteed to be 0 state. After running this circuit, the states in the D-bits are guaranteed to be 0 state. Here, this circuit uses 4 CNOT gates, which in FIG. 7($a$) are indicated by a "a" icon on one bit plus a connection line connecting another bit.

The "sub-circuit b" is as shown in FIG. 7($b$). Its function is to selectively move the data of m0 or m1 to the D-bit of the upper layer, according to the address data "addr" of the A-bit. In the case that A is 0, move the data "d0" of m0 (corresponding subscript is 0) to D-bits through the Toffoli gate; otherwise, in the case that A is 1, move the data "d1" of m1 (corresponding subscript is 1) to D-bits through the Toffoli gate. In the case that the positions of m0 and m1 are swapped, the functions thereof remain the same: that is, in the case that A is 0, the data of m0 is moved to the D-bits; in the case that A is 1, the data of m1 is moved to the D-bits. In FIG. 7($b$), the Toffoli gate is represented by a "⊕" icon on one bit plus connection lines connecting another two bits, wherein a solid center of the icon indicates actual control, i.e., to execute the quantum logic gate when the quantum state of the bit is 1; and wherein a hollow center of the icon indicates virtual control, i.e., to execute the quantum logic gate when the quantum state of the bit is 0.

In addition, a "sub-circuit c" implements the same function as the "sub-circuit b". By contrast, as shown in FIG. 7($c$), the sub-circuit c uses only one Toffoli gate, three CNOT gates and two NOT gates, which are relatively optimized (as the implementation of a Toffoli gate is very complicated), and can be used as equivalent alternatives. Here, a "e" icon on one bit indicates a NOT gate. It should be noted that this is not a specific limitation on construction of the basic quantum circuit required by the Basic Block: other quantum circuits that can realize the functions of "sub-circuit a" and "sub-circuit b" also fall within the scope of protection of this application.

Specifically, in a practical application, after outputting the data corresponding to the address at the subtree node of the root of the binary tree structure, uncomputing can be executed on the QRAM architecture, so as to restore the QRAM architecture to its original state.

Although the entire system architecture has taken out the data, it has not yet restored the original state. Restoring the original state is very important, because a query in a quantum algorithm often needs to be executed many times. Accordingly, our uncomputing process is to perform the data copy and propagation process in a reversed way, so as to restore the whole system to its original state. The total computing time required is N(14t+2t').

Specifically, the data stored in the leaf node includes a multi-bit number, wherein parent nodes of each leaf node corresponding to each bit of the multi-bit number are all different.

Alternatively, the data stored in the leaf node includes a plurality of multi-bit numbers, wherein continuous storage is executed for identical bits of the plurality of multi-bit numbers, and parent nodes of each one leaf node corresponding to each one bit of each multi-bit number are all different.

For the storage and reading of multi-bit data, the same architecture as before and a new memory storage method can be adopted. That is, when a multi-bit number needs to be stored, each bit of this number can be distributed to a different location for storage, so that parent nodes of each one leaf node corresponding to each one bit of the multi-bit number are all different. If 1024 64-bit floating-point numbers are to be stored, you only need to store all the 0-th bit of these 1024 numbers, and then store all the $1^{st}$ bits, . . . , so that parent nodes of each one leaf node corresponding to each one bit of the multi-bit number are all different.

When reading, due to the parallel characteristics of quantum, starting from the last layer of nodes, in the first log (1024)=10 steps, each bit of the multi-bit number can be taken out in parallel, because each one bit of the multi-bit number is in a different Basic Block. Accordingly, all the numbers you want are obtained on (log(64)=6)-th layer. Then, these data are taken out in turn. Finally, the uncomputing process is accomplished. Therefore, storing data in this way may realize simultaneous parallel processing of all bits of all numbers, realizing a certain acceleration effect as compared with continuous storage. Here, "continuous storage" means to continuously store the 0-th bit to the last bit of one number, and then continuously store the 0-th bit to the last bit of another number, and so on.

It can be seen that by proposing a valid design of a QRAM physical architecture which may be realized in an ideal noise-free physical system and has demands for planar and nearest neighbor interaction, which demands are only on the arrangement of qubits. Such a QRAM does not exceed the order of O(log(N)) in the running time length thereof, and therefore it can fully meet the demands of quantum algorithms. Moreover, a quantum circuit based on a QRAM only uses the most basic quantum logic gates that can be realized reasonably, so as to realize the function of storing an address and reading data in the form of quantum states, and to speed up the analysis and verification of complex quantum algorithms.

Figure 10:
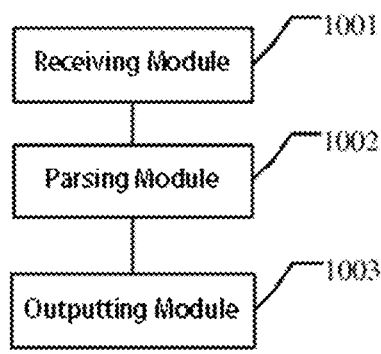
FIG. 10 is a schematic architectural illustration of a data reading device provided in an embodiment of the present application.

Referring to FIG. 10, which is a schematic architectural illustration of a data reading device provided in an embodiment of the present application, which is applied to a pre-constructed QRAM architecture for accessing data, wherein the QRAM architecture is a binary tree structure and comprises the following nodes: N layers of subtree node and one layer of leaf node, the subtree node comprising address bits and first data bits, and the leaf node comprising second data bits for storing data, the N being an address length, the device including:

a receiving module 1001, configured for receiving the address represented by a quantum state;

a parsing module 1002, configured for: parsing the address, and moving each bit of the address respectively to address bits of subtree node of a corresponding layer;

wherein each one bit of the address corresponds to one respective layer of the N layers of subtree node.

an outputting module 1003, configured for: starting from the leaf node, moving, according to an address stored in address bits of each layer of subtree node, data stored in the leaf node to data bits of the upper layer of subtree node, until data corresponding to the address is output at a subtree node at the root of the binary tree structure.

Specifically, the parsing module includes:

a first moving unit, configured for: for each bit of the address, starting from k=N, moving the k-th bit of the address to the first layer of subtree node at the root of the binary tree structure;

a second moving unit, configured for: starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

Specifically, the parsing module includes:

a third moving unit, configured for: for each bit of the address, starting from k=1, moving the k-th bit of the address to the first layer of subtree node at the root of the binary tree structure;

a fourth moving unit, configured for: starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;

wherein, after moving the k-th bit of the address in the current layer of subtree node to the lower layer of subtree node, moving a bit of the address next to the k-th bit of the address from the upper layer of subtree node to the current layer of subtree node.

Specifically, the first move unit is specifically configured for:

moving the k-th bit of the address to data bits of the first layer of subtree node at the root of the binary tree structure;

The second move unit is specifically configured for:

determining basic circuit structure in the binary tree structure, wherein the basic circuit structure comprising address bits and data bits of one subtree node and data bits of two child nodes in the lower layer of the one subtree node;

starting from the first layer of subtree node, executing repeatedly a first basic quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node, swapping the quantum state of the data bits of the subtree node of the k-th layer with the quantum state of the address bits of the subtree node, so as to move the k-th bit of the address to the address bit of the subtree node of the k-th layer.

In particular, the outputting module is specifically configured for:

starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the basic circuit structure.

Specifically, the device also includes:

an uncomputing module, configured for executing uncomputing on the QRAM structure to restore the QRAM structure to its initial state.

Specifically, data stored in the leaf node is a multi-bit number, wherein parent nodes of leaf nodes corresponding to each bit of the multi-bit number are all different; or data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

It can be seen that by proposing a valid QRAM architecture, the function of writing address in the form of a quantum state and reading data can be realized, thereby speeding up analysis and verification of complex quantum algorithms.

An embodiment of the present application also provides a storage medium having a computer program stored therein, wherein the computer program is configured to perform during execution thereof the method of any one of the method embodiments described above.

Specifically, in this embodiment, the above-mentioned storage medium may be configured to store a computer program for performing the following steps:

S1, receiving the address represented by a quantum state;

S2, parsing the address, and moving each bit of the address respectively to address bits of subtree node of a corresponding layer; wherein each one bit of the address corresponds to one respective layer of the N layers of subtree node; and S3, starting from the leaf node, moving, according to an address stored in address bits of each layer of subtree node, data stored in the leaf node to data bits of the upper layer of subtree node, until data corresponding to the address is output at a subtree node at the root of the binary tree structure.

Specifically, in this embodiment, the above-mentioned storage medium may include but not limited to: U disk, Read-Only Memory (referred to as ROM), Random Access Memory (referred to as RAM), mobile hard disk, magnetic disk or optical disk, and other media that can store computer programs.

An embodiment of the present application also provides an electronic device, including: a memory having a computer program stored therein, and a processor, configured to execute the computer program to perform the method of any one of the method embodiments described above.

Specifically, the electronic device may further include a transmission device and an I/O device, wherein the transmission device is connected to the processor, and the I/O device is connected to the processor.

Specifically, in this embodiment, the processor may be configured to perform the following steps via the computer program:

S1, receiving the address represented by a quantum state;

S2, parsing the address, and moving each bit of the address respectively to address bits of subtree node of a corresponding layer; wherein each one bit of the address corresponds to one respective layer of the N layers of subtree node; and S3, starting from the leaf node, moving, according to an address stored in address bits of each layer of subtree node, data stored in the leaf node to data bits of the upper layer of subtree node, until data corresponding to the address is output at a subtree node at the root of the binary tree structure.

The structure, features and effects of the present disclosure have been described in detail above based on the embodiments shown in the drawings. The above descriptions are only preferred embodiments of the present disclosure, and the present disclosure does not limit the scope of implementation to what is shown in the drawings. Any changes made according to the idea of the present disclosure or modifications to equivalent embodiments that are equivalent changes still within the spirit covered by the description and illustrations, shall fall into the protection scope of the present disclosure.

The invention claimed is:

1. A method for reading data, applied to a pre-constructed quantum random access memory (QRAM) architecture for accessing data, wherein the QRAM architecture is a binary tree structure having a root and comprises the following nodes: N layers of subtree node and one layer of a leaf node, the N being an address length; the method comprising:
determining an address represented by a quantum state distributedly stored in each layer of subtree node;
moving, according to the address, data stored in the leaf node to the upper layer of subtree node via a first preset quantum circuit, until the data corresponding to the address is output at a subtree node at the root of the binary tree structure;
receiving the address represented by a quantum state;
parsing the address; and
storing distributedly each bit of the address into address bits of the subtree node of a corresponding layer;
wherein the subtree node comprises address bits and first data bits, and the leaf node comprise second data bits for storing data;
wherein said "determining an address represented by a quantum state distributedly stored in each layer of subtree node" comprises: determining an address represented by a quantum state in address bits distributedly stored in each layer of subtree node;
wherein one layer of subtree node corresponds to one bit of address.

2. The method of claim 1, wherein said "moving, according to the address, data stored in the leaf node to the upper layer of subtree node via a first preset quantum circuit, until data corresponding to the address is output at subtree node at the root of the binary tree structure" comprises:
starting from the leaf node, moving data stored in the leaf node to data bits of the upper layer of subtree node via a first preset quantum circuit,
continuing to move, data stored in data bits of subtree node in the current layer to data bits of the upper layer of subtree node via the first preset quantum circuit, until data corresponding to the address is obtained and output at data bits of the subtree node at the root of the binary tree structure; wherein the first preset quantum circuit corresponds to a basic circuit structure in the binary tree structure, the basic circuit structure comprising address bits and data bits of one subtree node and data bits of two child nodes in the lower layer of the one subtree node, the data moved to a data bit of the subtree node in the upper layer is determined from the address stored in address bits in the basic circuit structure.

3. The method of claim 1, wherein said "storing distributedly each bit of the address into address bits of subtree node of a corresponding layer" comprises:
for each bit of the address, starting from k=N, moving the k-th bit of the address to the first layer of subtree node at the root of the binary tree structure;
starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

4. The method of claim 1, wherein said "storing distributedly each bit of the address into address bits of subtree node of a corresponding layer" comprises:
for each bit of the address, starting from k=1, moving the k-th bit of the address to the first layer of subtree node at the root of the binary tree structure;
starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;
wherein, after moving the k-th bit of the address in the current layer of subtree node to the lower layer of subtree node, moving a bit of the address next to the k-th bit of the address from the upper layer of subtree node to the current layer of subtree node.

5. The method of claim 3, wherein said "moving the k-th bit of the address to the first layer of subtree node at the root of the binary tree structure" comprises:
moving the k-th bit of the address to data bits of the first layer of subtree node at the root of the binary tree structure;
said "starting from the first layer of subtree node, executing repeatedly moving of the k-th bit of the address in the current layer of subtree node to the lower layer of subtree node, until it is moved to the address bits of the subtree node of the k-th layer" comprises:
starting from the first layer of subtree node, executing repeatedly a second preset quantum circuit corresponding to the basic circuit structure in the binary tree structure, so as to move the k-th bit of the address stored in data bits of the subtree node in the basic circuit structure to data bits of two child nodes in the lower layer, until the k-th bit of the address is moved to a data bit of the k-th layer of the subtree node,
swapping the quantum state of the data bits of the subtree node of the k-th layer with the quantum state of the address bits of the subtree node, so as to move the k-th bit of the address to the address bit of the subtree node of the k-th layer.

6. The method of claim 1, further comprises, after data corresponding to the address is output at a subtree node at the root of the binary tree structure:
executing uncomputing on the QRAM structure to restore the QRAM structure to its initial state.

7. The method of claim 1, wherein
data stored in the leaf node is a multi-bit number, wherein parent nodes of leaf nodes corresponding to each bit of the multi-bit number are all different; or
data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

8. A device for reading data based on address, applied to a pre-constructed quantum random access memory (QRAM) architecture for accessing data, wherein the QRAM architecture is a binary tree structure having a root and comprises the following nodes: N layers of subtree node and one layer of leaf node, the N being an address length; the device comprising:
- a determining module, configured for determining an address represented by a quantum state distributedly stored in each layer of subtree node;
- an outputting module, configured for moving, according to the address, data stored in the leaf node to the upper layer of subtree node via a first preset quantum circuit, until data corresponding to the address is output at a subtree node at the root of the binary tree structure.

9. A data reading method, applied to a pre-constructed QRAM architecture for accessing data, wherein the QRAM architecture is a binary tree structure having a root and comprises the following nodes: N layers of subtree node and one layer of leaf node, the subtree node comprising address bits and first data bits, and the leaf node comprising second data bits for storing data, the N being an address length, the method comprising:
- receiving the address represented by a quantum state;
- parsing the address, and moving each bit of the address respectively to address bits of the subtree node of a corresponding layer; wherein each one bit of the address corresponds to one respective layer of the N layers of subtree node; and
- starting from the leaf node, moving, according to an address stored in address bits of each layer of subtree node, data stored in the leaf node to data bits of the upper layer of subtree node, until data corresponding to the address is output at a subtree node at the root of the binary tree structure.

10. The method of claim 9, wherein said "moving each bit of the address respectively to address bits of subtree node of a corresponding layer" comprises:
- for each bit of the address, starting from k=N, moving the k-th bit of the address to the first layer of subtree node at the root of the binary tree structure;
- starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

11. The method of claim 9, wherein said "moving each bit of the address respectively to address bits of subtree node of a corresponding layer" comprises:
- for each bit of the address, starting from k=1, moving the k-th bit of the address to the first layer of subtree node at the root of the binary tree structure;
- starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N;
- wherein, after moving the k-th bit of the address in the current layer of subtree node to the lower layer of subtree node, moving a bit of the address next to the k-th bit of the address from the upper layer of subtree node to the current layer of subtree node.

12. The method of claim 10, wherein said "moving the k-th bit of the address to the first layer of subtree node at the root of the binary tree structure" comprises:
- moving the k-th bit of the address to data bits of the first layer of subtree node at the root of the binary tree structure;

said "starting from the first layer of subtree node, executing repeatedly moving of the k-th bit of the address in the current layer of subtree node to the lower layer of subtree node, until it is moved to the address bits of the subtree node of the k-th layer" comprises:
- determining basic circuit structure in the binary tree structure, wherein the basic circuit structure comprising address bits and data bits of one subtree node and data bits of two child nodes in the lower layer of the one subtree node;
- starting from the first layer of subtree node, executing repeatedly a first basic quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node,
- swapping the quantum state of the data bits of the subtree node of the k-th layer with the quantum state of the address bits of the subtree node, so as to move the k-th bit of the address to the address bit of the subtree node of the k-th layer.

13. The method of claim 12, wherein said "starting from the leaf node, moving, according to an address stored in address bits of each layer of subtree node, data stored in the leaf node to data bits of the upper layer of subtree node, until data corresponding to the address is output at a subtree node at the root of the binary tree structure" comprises:
- starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the basic circuit structure.

14. The method of claim 9, further comprises, after data corresponding to the address is output at a subtree node at the root of the binary tree structure:
- executing uncomputing on the QRAM structure to restore the QRAM structure to its initial state.

15. The method of claim 9, wherein
- data stored in the leaf node is a multi-bit number, wherein parent nodes of leaf nodes corresponding to each bit of the multi-bit number are all different; or
- data stored in the leaf node is a plurality of multi-bit numbers, wherein continuous storage is executed for identical bits of the plurality of multi-bit numbers, and parent nodes of each one leaf node corresponding to each one bit of each multi-bit number are all different.

16. A data reading device, applied to a pre-constructed QRAM architecture for accessing data, wherein the QRAM architecture is a binary tree structure having a root and comprises the following nodes: N layers of subtree node and one layer of leaf node, the subtree node comprising address bits and first data bits, and the leaf node comprising second data bits for storing data, the N being an address length, the device comprising:
- a receiving module, configured for receiving the address represented by a quantum state;
- a parsing module, configured for: parsing the address, and moving each bit of the address respectively to address bits of the subtree node of a corresponding layer; wherein each one bit of the address corresponds to one respective layer of the N layers of subtree node;

an outputting module, configured for: starting from the leaf node, moving, according to an address stored in address bits of each layer of subtree node, data stored in the leaf node to data bits of the upper layer of subtree node, until data corresponding to the address is output at a subtree node at the root of the binary tree structure.

17. A storage medium having a computer program stored therein, wherein the computer program is configured to perform during execution of the method of claim 1.

18. An electronic device, comprising:
a memory having a computer program stored therein, and
a processor, configured to execute the computer program to perform the method of claim 1.

* * * * *